United States Patent [19]

Franco et al.

[11] 4,004,044
[45] Jan. 18, 1977

[54] METHOD FOR FORMING PATTERNED FILMS UTILIZING A TRANSPARENT LIFT-OFF MASK

[75] Inventors: Jack R. Franco, Poughkeepsie; Janos Havas, Hopewell Junction; Lewis J. Rompala, Wappingers Falls, all of N.Y.

[73] Assignee: International Business Machines Corporation, Armonk, N.Y.

[22] Filed: May 9, 1975

[21] Appl. No.: 576,054

[52] U.S. Cl. .................................. 427/43; 427/99; 427/259; 427/53; 204/192; 204/298; 156/657; 156/659; 156/673
[51] Int. Cl.² .................. B05D 5/12; B05D 1/32
[58] Field of Search ........... 204/192, 298; 427/259, 427/88, 89, 96, 43, 38, 98, 99, 41; 156/3, 11, 13

[56] References Cited

UNITED STATES PATENTS

| | | | |
|---|---|---|---|
| 3,002,848 | 10/1961 | Clark | 427/96 X |
| 3,113,896 | 12/1963 | Mann | 427/43 X |
| 3,795,557 | 3/1974 | Jacob | 204/192 X |
| 3,867,216 | 2/1975 | Jacob | 204/192 X |
| 3,873,361 | 3/1975 | Franco et al. | 204/192 X |

OTHER PUBLICATIONS

Beyer et al., "Forming Organo Silicon Layer on a Substrate Coated by a Photopolymer," IBM Technical Disclosure Bulletin, vol. 17, No. 6, Nov. 1974, pp. 1600–1601.

*Primary Examiner*—Ronald H. Smith
*Assistant Examiner*—Evan K. Lawrence
*Attorney, Agent, or Firm*—Robert J. Haase

[57] ABSTRACT

A lift-off method for use in depositing thin films in the fabrication of integrated circuits which avoids edge tearing of the films. The method involves depositing an organic polymeric first masking material on a substrate, and forming on said material a layer of a polydimethylsiloxane resin material. The material, in turn, is covered by a second masking layer, preferably an organic polymeric resist material into which openings are placed in a selected pattern utilizing lithographic techniques. Then, conforming openings are placed in the underlying polydimethylsiloxane resin material and the openings are extended through the underlying resist material by successive reactive sputter etching steps to expose the substrate surface in the aforesaid selected pattern. The thin film to be deposited is then applied over the resulting structure; it is, thereby, deposited on the substrate in said openings. The final reactive sputter etching step affords edges in the openings through the resin material layer which overhang the edges in the openings through the first masking layer affording easy lift-off of the unwanted areas of the deposited film when the first masking layer is totally removed by application of solvent.

7 Claims, 8 Drawing Figures

METHOD FOR FORMING PATTERNED FILMS UTILIZING A TRANSPARENT LIFT-OFF MASK

BACKGROUND OF THE INVENTION

This invention relates to a method of depositing thin films, particularly thin films such as metallic films, in the fabrication of integrated circuits.

Present trends in the formation of vacuum deposited thin metallic film commonly use chemical etching in the presence of etch-resistant masking layers to provide the selected pattern. This is the traditional photo engraving or photo lithographic etching technique. However, with the continued miniaturization of semiconductor integrated circuits to achieve greater component density and smaller units in large scale integrated circuitry, the art is rapidly approaching a point where such photo lithographic etching of deposited film may be impractical for providing the minute resolution required for the fine line work of metallization in such large scale integrated circuitry.

An alternative method for forming such metallization is commonly denoted by the term "expendable mask method," "lift-off method," or "stencil method." U.S. Pat. No. 3,873,361, issued Mar. 25, 1975 to Havas et al, entitled "A Method of Depositing Thin Film Utilizing a Lift-off Mask" and assigned to the present assignee discloses a lift-off method for depositing thin films which avoids the "edge-tearing" problem and is suitable for use were the lateral widths of the spacing between adjacent deposited metallic lines is of the order of 0.05 to 0.25 mils. The disclosed method includes the use of an organic polymeric material deposited on the integrated circuit substrate and an overlying layer of an inorganic material, preferably metal, having openings in the selected pattern. Openings are formed in the polymeric material by reactive sputter etching utilizing the metallic mask as a barrier. The openings in the polymeric layer are aligned with and laterally wider than the corresponding openings in the metallic masking layer as a consequence of the reactive sputter etching step. Thus, the edges of the openings in the metallic masking layer overhang the edges of the openings in the underlying polymeric layer. The thin film to be deposited is then applied over the structure and on the surface of the substrate exposed by the openings in the polymeric material. When the polymeric material is removed by application of solvent, the metallic masking layer and the thin film above the masking layer "lift off" to leave the thin film deposits in the selected pattern on the substrate without "edge tearing" of the desired deposited thin film as the unwanted portions of the thin film are lifted off.

With the metallic overlay process, i.e., the use of the metallic (opaque) reactive sputter etching mask, alignment of overlying patterned layers with respect to the underlying patterned substrate can be difficult. One reason for this is that the typography of the underlying substrate is made quasi-planar by the spun-on polymeric layer upon which the metal mask is evaporated. Another reason is that the opacity of the metal makes it troublesome optically to distinguish alignment marks on the substrate. This alignment problem is alleviated in accordance with the teachings of the aforementioned patent by reserving two alignment areas at opposite ends of the wafer substrate which are left unmetallized during metal mask evaporation. An undesirable consequence is that the alignment areas are not available to be used for the production of active circuit components and reduces circuit yield on each wafer. Additionally, the use of the evaporated metal reactive sputter etching masking layer requires the use of a relatively expensive and time consuming evaporation step and a subsequent chemical etching step to pattern the evaporated layer.

SUMMARY OF THE INVENTION

The disclosed lift-off process retains the fine-line definition qualities of the prior art lift-off technique but avoids the use of an evaporated opaque reactive sputter etching masking layer. An easily applied, transparent, polydimethylsiloxane resin layer permits easy optical alignment and eliminates the need for yield-reducing dedicated alignment areas on the substrate wafer. Not only is usable circuit area increased but the process is simplified. The polydimethylsiloxane resin layer is apertured in a reactive sputter etching chamber using a fluorine gas ambient which readily permits the subsequent aperturing of the underlying polymeric layer merely by substituting an oxygen gas ambient for the fluorine gas ambient in the same reactive sputter etching chamber.

Briefly, the method of the present invention comprises the deposition of a first organic polymeric masking layer on a substrate. The first layer is baked to improve adhesion and thermal stability. A polydiemthylsiloxane resin layer having a preponderance of Si-O bonds relative to Si-$CH_3$ bonds is spun-on over the polymeric layer. A second masking layer which may be a photoresist layer or an electron beam resist layer is placed on the resin layer. The second masking layer is patterned using standard photo or electron beam lithographic techniques to expose portions of the resin layer in the desired pattern. Using the patterned second masking layer as a mask, openings are reactively sputter etched in the resin layer using a flourine gas ambient. Then, conforming openings are made in the first masking layer by a second reactive sputter etching step in the same sputtering chamber using an oxygen gas ambient instead of the fluorine gas ambient. Overetching of the first masking layer produces an overhang of the openings in the overlying polydimethylsiloxane resist layer which facilitates easy lift-off of the unwanted portions of the finally deposited thin film.

DESCRIPTION OF THE PREFERRED EMBODIMENT

Figure 1A:
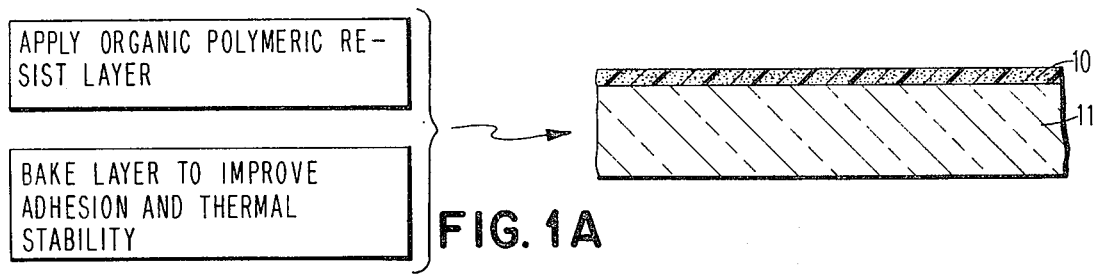
FIGS. 1A-1H are diagrammatic cross-sectional views of the structure at successive steps during its fabrication in accordance with the preferred embodiments of the present invention, as well as the flow chart describing the steps.

FIGS. 1A-1H show the formation of the composite mask in accordance with the method of the present invention as well as the utilization of this composite mask for lift-off purposes. With reference to FIG. 1A, an organic polymeric masking layer 10 is formed on substrate 11. Preferably, layer 10 comprises AZ-1350 type polymer which is baked at about 210° C, to improve adhesion to substrate 11. The baking also renders the layer thermally stable and also non-photosensitive, the latter result being of no consequence. The thickness of layer 10 determines the maximum thickness of the functional film that can be lifted off upon removal of layer 10 and is variable according to requirements. In the fabrication of integrated circuits, substrate 11 may be a semiconductor material or a semiconductor substrate having a surface layer of an electrically insulative inorganic material, such as silicon dioxide. Layer 10 may be any polymeric material used in coating which exhibits good adhesion to the substrate 11 (as well as to the subsequently applied polydimethylsiloxane resin layer), is thermally stable, and which is removable by reactive sputter etching. The preferred organic polymeric masking material AZ-1350 type comprises a novolac-type phenol-formaldehyde resin and a photosensitive cross-linking agent and is commercially available from the Shipley Corporation. When the photoresist material 10 is baked at about 210° C to improve adhesion to the underlying substrate 11, the photoresist is rendered thermally stable as well as non-photosensitive. The loss of photo sensitivity is no disadvantage because layer 10 is selectively removed by reactive ion sputtering. Other suitable photoresist materials include KTFR available from the Kodak Corporation, synthetic resins such as polyvinyl cinemate and polymethyl methacrylate, diazo type photoresists and polyimides, among others.

Figure 1B:
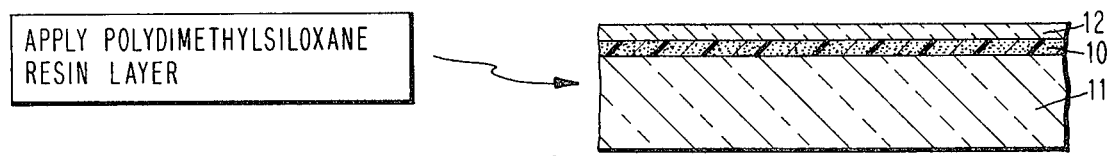

Next, as set forth in FIG. 1B, a layer of polydimethylsiloxane resin material 12 is deposited on layer 10. The resin is spun-on to the surface of layer 10. Spinning speed is about 4,200 rpm. Material 12 preferably comprises a 1,500–1,600 Angstrom thick film of Owens-Illinois type 650 resin dissolved in n-butyl acetate, 1 gram of resin to 10 milliliters of solvent. Polydimethylsiloxane material 12 is characterized by a preponderance of Si-O bonds relative to the number of $Si-CH_3$ bonds. The polydimethylsiloxane resin layer 12 is baked in a nitrogen ambient at about 210° C for about 10 to 15 minutes.

Figure 1C:
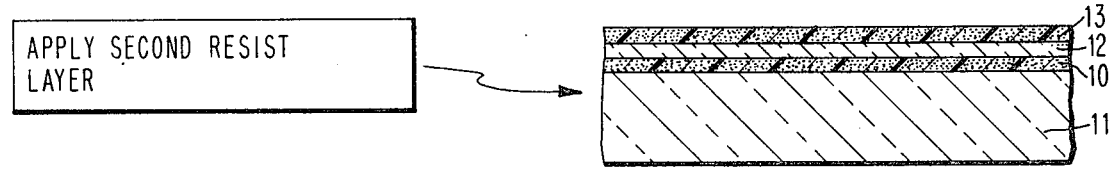
Figure 1D:

As set forth in FIGS. 1C and 1D, a layer of photo or electron beam resist 13 is spun-on to the polydimethylsiloxane layer 12. HMDS 5 (hexamethyldisilazane) or A-1100 silane (available from Union Carbide Corporation) can be used for pretreatment of layer 12 to prepare it for AZ-type photoresist material 13. Openings such as opening 14 is produced in layer 13 by conventional lithographic techniques such as used in the integrated circuit fabrication art. It is to be noted that polydimethylsiloxane resin layer 12 is transparent, permitting the optical alignment of later applied mask patterns to the patterned surface of substrate 11. In particular, no alignment tabs are required which would limit the available active device area on substrate 11 as would be the case where layer 12 consisted of an opaque material precluding see-through optical alignment.

Figure 1E:
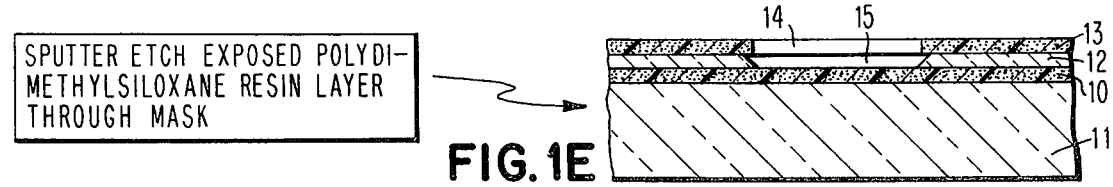

The exposed and patterned layer 13 then is used as a mask for the reactive ion etching of polydimethylsiloxane resin layer 12 as shown in FIG. 1E. The structure of FIG. 1E is placed into an RF sputter etching chamber such as described in U.S. Pat. No. 3,598,710. The resin layer 12 is etched preferably with DE-100 gas which is a fluorine-containing gas consisting of $CF_4$ and $O_2$ marketed by LFE Corporation. Thus, opening 14 in layer 13 is effectively transferred into resin layer 12 as opening 15. Resist layer 13 then is removed by a suitable solvent.

Figure 1F:

Using polydimethylsiloxane mask 12 with openings 15 as shown in FIG. 1F, the polymeric masking layer 10 is apertured by reactive ion etching in an oxygen ambient. The oxygen plasma is determined by the desired magnitude of the overhang 17 (in the opening 15 of layer 12) with respect to the opening 16 sputter-etched into polymeric layer 10. For example, a distinct overhang can be achieved at 40 millitorr oxygen pressure whereas substantially no overhang is produced when etching is done at 4 millitorr oxygen pressure. The successive reactive ion sputter etching steps undertaken in accordance with the steps associated with FIGS. 1E and 1F are conveniently accomplished in the same reactive sputter etching chamber utilizing first a fluorine-containing gas atmosphere (in the case of FIG. 1E) followed by a purging and substitution of an oxygen gas ambient (in the case of FIG. 1F).

The overhang 17 in resin layer 12 permits considerable "over etching" of the polymeric layer 10 to assure that all of the material of layer 10 has been removed in the locations of the desired opening 16. The pattern dimensions of the functional thin film material to be deposited on substrate 11 through openings 15 and 16 are determined by the overhang aperture size in layer 12 and not by the greater aperture size in layer 10. Additionally, the overhang 17 aids in the elimination of "edge tearing" when the thin film material is lifted off in subsequent steps of the present process.

Figure 1G:
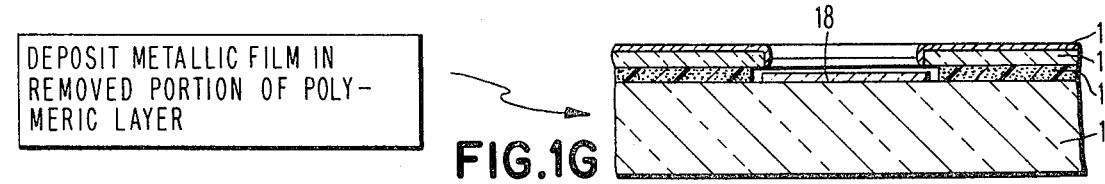

Next, using the lift-off composite structure of FIG. 1F, a functional metallic film 18 is deposited over the structure as shown in FIG. 1G. This metallic film may be any metal conventionally used for integrated circuit metallization, e.g., aluminum, aluminum-copper alloys, platinum, palladium, chromium, etc. The metal film 18 is deposited at a temperature of from room temperature to about 150° C. Alternatively, layer 18 may be an inorganic electrically insulative material, such as, silicon dioxide or silicon nitride. Film 18 has a thickness in the order of 15,000 Angstoms to 25,000 Angstroms.

Figure 1H:
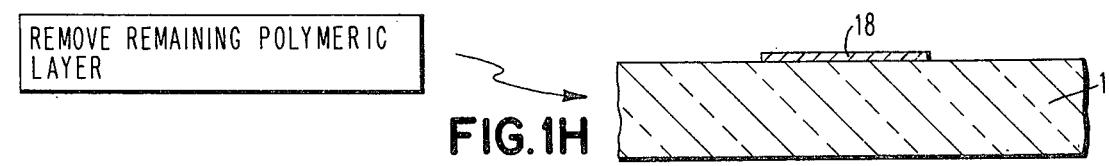

Finally, utilizing conventional lift-off removal techniques, photoresist layer 10 is completely removed by immersion into a solvent, such as, N-methyl pyrrolidone standard photoresist solvent, for about 15 to 30 minutes, which leaves thin film layer 18 in the desired pattern configuration of FIG. 1H. The solvent selected should be one which dissolves or swells the polymeric material of layer 10 without affecting the thin film 18. Such solvents include acetone, isopropanol, methyl ethyl ketone or trichloroethylene. The solvents used to dissolve the polymeric material may be the same solvents used in applying the polymer coating 10.

For second-level metallurgy, if any is desired, a layer of silicon dioxide (not shown) is placed over the patterned structure of FIG. 1H and the process steps of FIGS. 1A-1H are repeated to provide a patterned second thin film electrically insulated from the underlying first patterned film 18. Polydimethylsiloxane resin layer 12 is resistant to argon ion sputter etching which may be used to clean the first layer metal through via holes formed in the insulating oxide layer. Other desirable properties possessed by the polydimethylsiloxane material 12 include the following:

1. Resistant to reactive sputter etching in an oxygen ambient. Oxygen ambient etching is preferred to place openings in photoresist layer 10 without attacking substrate 11.
2. At least as thermally stable as layer 10.
3. Adherent to layer 10.
4. Etchable by an agent (fluorine gas ions) which does not attack layers 10 and 13.
5. Transparent.

6. Etchable in the same sputtering chamber as used to etch layer 10 merely by changing the reactive ambient gas.

7. Chemically inert to wet chemicals used in pre-cleaning wafer prior to depositing thin film 18.

While the invention has been particularly shown and described with reference to the preferred embodiments thereof, it will be understood by those skilled in the art that various changes in the form and details may be made therein without departing from the spirit and scope of the invention.

What is claimed is:

1. A lift-off method for forming a patterned film on a substrate comprising:
    forming on said substrate a first masking layer of organic polymeric material,
    forming on said first layer a transparent layer of polydimethylsiloxane resin material having a preponderance of Si-O bonds relative to the number of Si-CH$_3$ bonds,
    forming on said layer of resin material a second masking layer having openings in a desired pattern,
    forming by reactive sputter etching in a first gas ambient including a fluorine-containing gas openings through said layer of resin material aligned with said openings in said second masking layer,
    forming by reactive sputter etching in a second gas ambient including oxygen openings through said first masking layer aligned with said openings in said layer of resin material, the last named reactive sputter etching being continued until the edges in said openings through said resin material overhang the edges in said openings through said first masking layer,
    depositing said film onto said substrate through said openings in said layer of resin material and said first masking layer, and
    removing said layers.

2. The method defined in claim 1 wherein said reactive sputter etching steps take place successively in the same sputter etching chamber.

3. The method defined in claim 1 wherein said first layer is baked prior to said forming of said layer of resin material.

4. The method defined in claim 1 wherein said second masking layer is a photoresist material.

5. The method defined in claim 1 wherein said second masking layer is an electron beam resist material.

6. A method for forming a patterned mask on a substrate comprising:
    forming on said substrate a first masking layer of organic polymeric material,
    forming on said first layer a layer of polydimethylsiloxane resin material having a preponderance of Si-O bonds relative to the number of Si-CH$_3$ bonds,
    forming on said layer of resin material a second masking layer having openings in a desired pattern,
    forming by reactive sputter etching in a first gas ambient including a fluorine-containing gas openings through said layer of resin material aligned with said openings in said second masking layer, and
    forming by reactive sputter etching in a second gas ambient including oxygen openings through said first masking layer aligned with said openings in said layer of resin material.

7. The method defined in claim 6 wherein said reactive sputter etching steps take place successively in the same sputter etching chamber.

* * * * *